SEMICONDUCTOR DEVICE HEADER WITH SEMICONDUCTOR SUPPORT

Filed March 1, 1963 2 Sheets-Sheet 1

Larry A. Harmon
Yung Tao
INVENTORS

BY

ATTORNEY

SEMICONDUCTOR DEVICE HEADER WITH SEMICONDUCTOR SUPPORT

Filed March 1, 1963 2 Sheets-Sheet 2

Larry A. Harmon
Yung Tao
INVENTORS

BY

ATTORNEY

United States Patent Office 3,204,023
Patented Aug. 31, 1965

3,204,023
SEMICONDUCTOR DEVICE HEADER WITH SEMICONDUCTOR SUPPORT

Larry A. Harmon, Dallas, and Yung Tao, Richardson, Tex., assignors to Texas Instruments Incorporated, Dallas, Tex., a corporation of Delaware Filed Mar. 1, 1963, Ser. No. 262,029
1 Claim. (Cl. 174—52)

This invention relates generally to a header for mounting a semiconductor device, and more particularly to a header having a stabilized electrically isolated, conductive surface for mounting a semiconductor device.

Transistors and other semiconductor devices are commonly mounted on a header and are hermetically sealed within a can to provide a mounting surface and a means to encapsulate the device within a favorable atmosphere.

This invention relates to such a semiconductor device enclosure, and is specifically concerned with a transistor mounted in electrical contact with one of the leads of the header, but electrically isolated from the metallic header case, commonly referred to as an isolated lead device.

Because semiconductor devices are often subjected to high accelerations and extreme vibrations during use, there is often a high failure rate due to the breakage of the electrical connections to the active regions of the device. The breakage is usually attributed to a relative motion between the semiconductor device and the leads passing through the header to which the electrical connections to the semiconductor device are made.

This invention eliminates the relative motion and thus avoids failure from the breakage of the electrical connections.

It is therefore an object of this invention to provide a semiconductor device header having a stabilized electrically isolated, conducting surface for mounting a semiconductor device.

Another object of the invention is to provide a semiconductor device having a plurality of electrical leads and a stabilized conducting surface for mounting a semiconductor device thereon which is electrically connected to one of the leads but electrically isolated from the header case.

A further object of the invention is to provide a semiconductor device header having a plurality of electrically isolated leads and a stabilized mounting surface for a semiconductor device that is electrically isolated from the header case and has a fixed position relative to the leads.

Still another object is to provide a header of the type described having a mounting surface whose area is large in comparison with the area of the mounting surface of the semiconductor device.

A feature of the preferred embodiment of the invention that provides stability of the mounting surface is that said surface is partially embedded in and sealed to a preformed glass foundation.

Other objects, features and advantages of the invention will become apparent from the following detailed description when read in conjunction with the appended claim and the attached drawing wherein like reference numerals refer to like parts throughout the several figures, and in which:

Figure 4A:
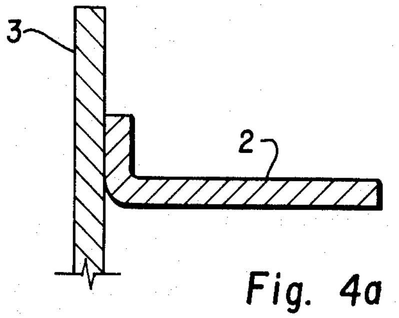
Figure 4B:
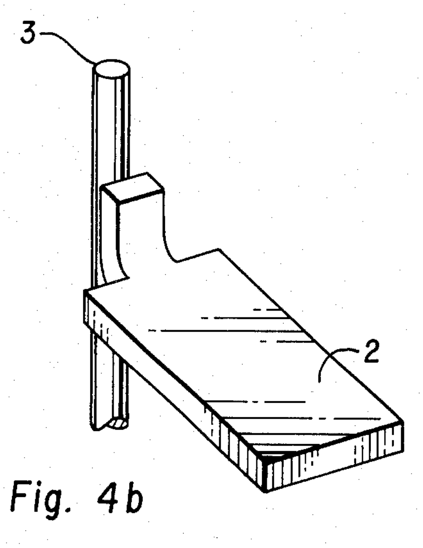
Figure 5A:
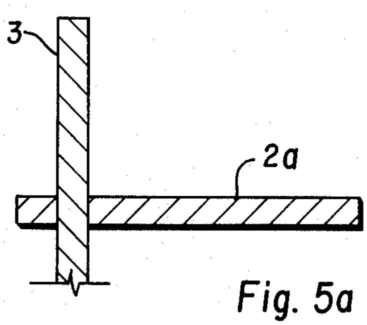
Figure 5B:
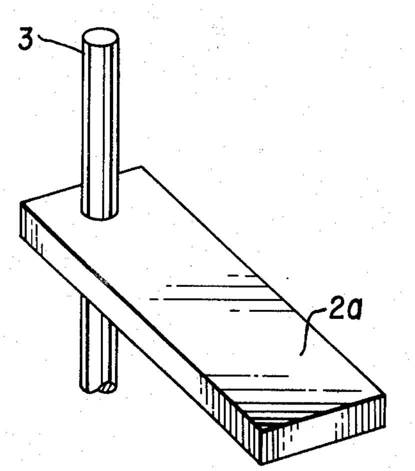

FIGURE 4*a* shows in section the mounting surface attached to a lead;

FIGURE 4*b* is an isometric illustration of the mounting surface and lead shown in FIGURE 4*a*;

FIGURE 5*a* shows in section another form of attachment between the mounting surface to the lead, and FIGURE 5*b* is an isometric illustration of the mounting surface and lead shown in FIGURE 5*a*.

The preferred embodiment of the invention may be briefly described with reference to a transistor header of conventional design. One such conventional header comprises an annular metallic shell, or case, that incloses a preformed glass foundation and is hermetically sealed therewith. A plurality of leads are sealed through the glass and project beyond both the surface of the glass and the surface of the shell.

Moreover, the leads are electrically isolated from each other and from the metallic case. According to the preferred embodiment of the invention, a conductive member having a flat surface on which a semiconductor device can be mounted is partially embedded in and sealed with the glass so that the flat surface is exposed at the upper surface of the glass. The mounting member is prefabricated separately from any of the leads before embedding it in fixed relation to the surface of the glass. Prior to embedding, the mounting member is electrically connected to one of the leads by any suitable means such as welding, soldering or the like, as hereinafter described.

Because of its sparate identity from the lead to which it is welded, the mounting member can be prefabricated to any desired dimension of surface or width, thus permitting subsequent mounting thereon of a great variety of sizes of semiconductor devices. And because the semiconductor device is thus mounted on a stabilized flat surface, failure of the device from severe vibrations and shock is prevented. Another advantage results from the improved heat transfer from the device to the case because of the wide area path through the thin layer of glass securing the mounting member to the header top.

Figure 1:
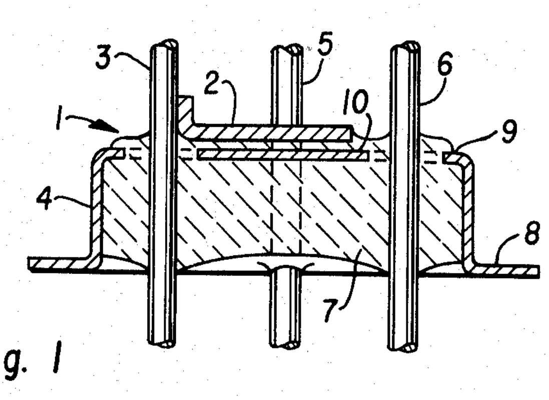
FIGURE 1 is a view in section of the preferred embodiment of the invention.
Figure 2:
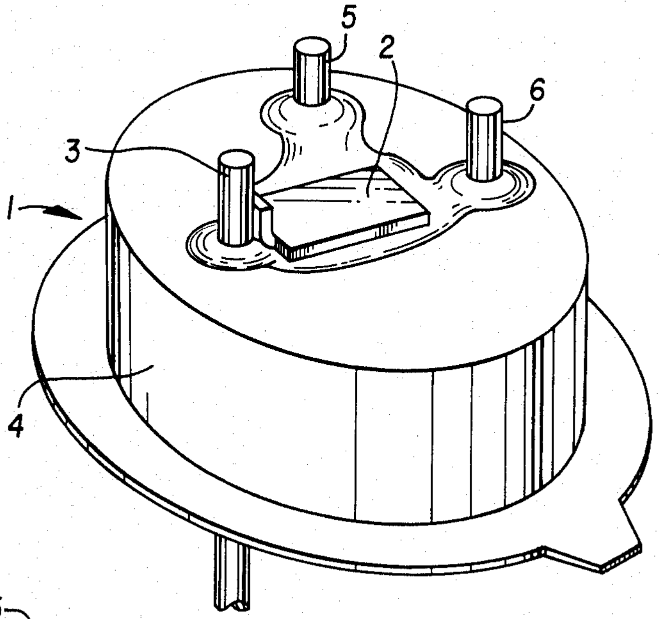
FIGURE 2 is a pictorial view of the completed header of FIGURE 1.
Figure 3:
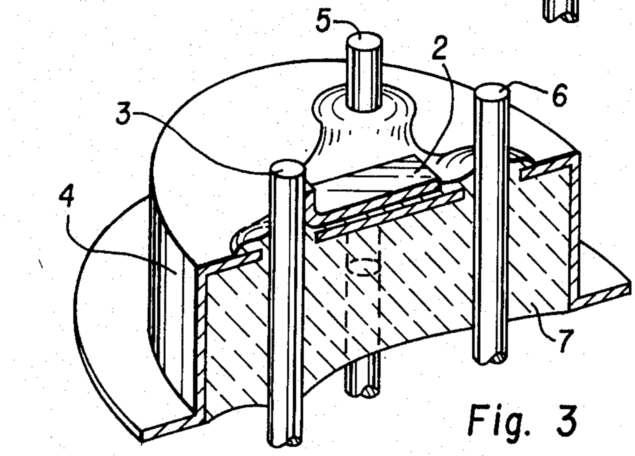
FIGURE 3 is a pictorial view of the header in section.

Referring now to FIGURES 1, 2 and 3, there is shown the preferred embodiment of the invention, FIGURE 1 being a sectional view taken across a metallic transistor header 1 encasing a glass preform 7 with leads 3, 5 and 6 passing through the preform. The header 1 has a flange 8 at the bottom, vertical sides 4 extending up to and joining the top surface of the header, indicated at 9 and 10. The top portion of the header is a flat surface having holes therein through which leads 3, 5 and 6 pass. The glass preform 7, being provided with suitable holes of predetermined location for receiving therethrough the above leads, is fitted within the header substantially flush with the lower surface of flange 8. A metallic plate 2 of any desired length, width or shape, having a portion bent at 90° angle from the surface thereof, as shown in FIGURES 4*a* and 4*b*, or having a hole in one end as shown in FIGURES 5*a* and 5*b*, is electrically connected to lead 3 by any suitable means such as welding, soldering or the like. Connection of plate 2 to lead 3 is made prior to inserting the lead through the glass and prior to positioning the plate near the surface top 10 of the header. A portion of leads 3, 5 and 6 protrude above the surface of the plate 2 for purposes to be discussed hereinafter.

The unit, after being assembled as shown, is conveyed through a furnace to hermetically seal the glass preform 7 to the metallic surfaces to which it is to adhere. Upon heating, the glass flows through the holes through which leads 3, 5 and 6 pass, and around and under the plate 2, or in the alternate a small thin glass preform may be placed between the plate 2 and header top 10, embedding and joining plate 2 to header top 10 in this manner. Particular combination of metals and glass are especially suitable for this purpose because of their similar coefficients of thermal expansion. A preferred example of such a combination, well-known in the transistor art, is Kovar, a trademark for a nickel-iron-cobalt alloy, and a borosilicate glass comprised of about 65% silicon dioxide, 3.5% aluminum trioxide, 3.7% potassium oxide, 4.5% sodium oxide, 21.0% boron trioxide and minor percentages of various impurities, and commonly known as Corning Glass 7052. However, any suitable metals or alloys and any suitable insulating material may be used for this purpose.

In the preferred example above, the surfaces of the Kovar are oxidized to increase the wetting ability of the glass thereto, and the unit is loaded in a graphite boat (not shown) and conveyed through a furnace, the typical temperatures, times, etc., being well-known to those of this art.

As the unit passes through the furnace, the glass preform becomes plastic. Since it is desirable that the plate 2 be maintained in its proper position and be partially embedded in the surface of the glass after the glass has hardened, some means must be provided to ensure that the leads 3, 5 and 6 are held rigidly in place during the heating operation. This is accomplished by providing recesses in the graphite boat for receiving those portions of the leads that protrude above the upper surfaces of the header.

A view of the completed header is shown in FIGURE 2 after the preform has been hermetically joined to all of the metallic surfaces which it contacts. The plate 2 is partially embedded in the glass, and a slight meniscus is formed at the extremities of the plate. A pictorial section of the completed header is shown in FIGURE 3.

In FIGURES 4*a*, 4*b*, 5*a* and 5*b* are shown two methods of securing the plate 2 to lead 3. These are given by way of example and should not be considered as the only manner in which the connection is to be made. The plate 2 is shown in a rectangular configuration, but in practice may be round or any other shape to accommodate the semiconductor devices to be mounted thereon.

The semiconductor device may be mounted on the surface of plate 2 in any conventional manner to make electrical contact therewith, and suitable electrical wires may be provided to connect various regions of the device with leads 5 and 6, respectively. A transistor can (not shown) is provided over the top of the header and welded to the annular flange 8 in a conventional manner to encapsulate the device.

Because of the flexibility in the size of metallic plate

2 that can be used, semiconductor devices of a greater variety of sizes may be mounted thereon. An additional feature of the invention resides in the fact that the mounting surface of the semiconductor device is not subject to cantilever action since member 2, fixed only at one end on lead 3 and supporting the semiconductor device, is partially embedded in glass and therefore rigidly secured against cantilever action. Hence, severe vibrations, accelerations and the like, do not cause a relative movement between the semiconductor device and any of the leads.

Although the invention has been described with reference to a specific embodiment, it will be apparent that certain modifications and substitutions will fall within the scope of the invention as defined by the appended claim.

What is claimed is:

A header for a semiconductor device comprising a metallic shell having a plurality of openings in the top thereof to accommodate lead wires therethrough, a continuous mass of insulating material within said shell and extending through said openings coating a portion of the top of said shell, a plurality of lead wires each of which passes through a different one of said openings and is insulated from said shell by said insulating material which extends through such opening, and a flat metallic plate attached to one of said lead wires and partially embedded in and insulated from the top of said shell by the part of said continuous mass of insulating material which coats said portion of the top of the shell.

References Cited by the Examiner

UNITED STATES PATENTS

| | | | |
|---|---|---|---|
| 2,263,396 | 11/41 | Power | 174—50 X |
| 2,582,931 | 1/52 | Kodama | 339—218 X |
| 2,673,335 | 3/54 | Verdon | 339—275 X |
| 2,947,925 | 8/60 | Maynard et al. | 317—235 |
| 2,985,806 | 5/61 | McMahon et al. | 317—235 |
| 3,002,271 | 10/61 | Thornton | 29—155.59 X |
| 3,020,454 | 2/62 | Dixon. | |
| 3,041,510 | 6/62 | Hower et al. | 317—235 |
| 3,136,050 | 6/64 | Trueb et al. | |

FOREIGN PATENTS

| | | |
|---|---|---|
| 643,753 | 6/62 | Canada. |

JOHN F. BURNS, *Primary Examiner.*

JOHN P. WILDMAN, E. JAMES SAX, LARAMIE E. ASKIN, *Examiners.*